United States Patent
Henderson et al.

(10) Patent No.: US 9,099,518 B1
(45) Date of Patent: Aug. 4, 2015

(54) ELECTROSTATIC DISCHARGE PROTECTION DEVICE

(71) Applicant: TriQuint Semiconductor, Inc., Hillsboro, OR (US)

(72) Inventors: Timothy S. Henderson, Portland, OR (US); Robert E. Knapp, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 14/172,800

(22) Filed: Feb. 4, 2014

(51) Int. Cl.
| | | |
|---|---|---|
| *H01L 29/74* | (2006.01) | |
| *H01L 31/072* | (2012.01) | |
| *H01L 21/331* | (2006.01) | |
| *H01L 29/732* | (2006.01) | |
| *H01L 29/66* | (2006.01) | |

(52) U.S. Cl.
CPC ........ *H01L 29/732* (2013.01); *H01L 29/66272* (2013.01)

(58) Field of Classification Search
CPC ............ H01L 29/735; H01L 29/66272; H01L 29/66242; H01L 29/66318; H01L 29/7371; H01L 27/082; H01L 27/0605; H01L 27/0826; H01L 21/8252; H01L 21/82285
USPC ................. 438/309, 312–314, 316, 318, 322; 257/164, 192, 197, 552, 580–583
See application file for complete search history.

(56) References Cited

U.S. PATENT DOCUMENTS

| | | | |
|---|---|---|---|
| 6,878,976 B2* | 4/2005 | Coolbaugh et al. | ........... 257/183 |
| 7,280,332 B2 | 10/2007 | Ma et al. | |
| 7,408,752 B2 | 8/2008 | Ma et al. | |
| 7,773,355 B2 | 8/2010 | Ma et al. | |
| 2004/0214401 A1* | 10/2004 | Krueger et al. | ............... 438/317 |
| 2008/0237645 A1* | 10/2008 | Uchino | ........................ 257/203 |
| 2009/0283802 A1* | 11/2009 | Henderson et al. | ........... 257/198 |
| 2012/0113553 A1* | 5/2012 | Dupuis | .......................... 361/56 |

FOREIGN PATENT DOCUMENTS

| | | | |
|---|---|---|---|
| JP | 2006135199 A | 5/2006 | |
| JP | 2010287603 A | 12/2010 | |
| KR | 101293352 B1 | 8/2013 | |

OTHER PUBLICATIONS

Ma et al.; "ESD Protection Design Considerations for InGaP/GaAs HBT RF Power Amplifiers"; IEEE Transactions on Microwave Theory and Techniques; vol. 53; No. 1; pp. 221-228; Jan. 2005.
International Search Report and Written Opinion for PCT/US2015/013592, mailed May 21, 2015, 13 pages.

* cited by examiner

*Primary Examiner* — Hsien Ming Lee
(74) *Attorney, Agent, or Firm* — Withrow & Terranova, P.L.L.C.

(57) ABSTRACT

Various embodiments provide an electrostatic discharge (ESD) protection device. The ESD protection device may include a subcollector, collector, base, and emitter formed in layers on top of one another. The emitter may include a different semiconductor than a semiconductor included in the base to form a heterojunction. The ESD protection device may include a collector contact disposed on the subcollector and an emitter contact disposed on the emitter. The ESD protection device may be a two-terminal device, with no conductive base contact coupled with the base.

20 Claims, 6 Drawing Sheets

ELECTROSTATIC DISCHARGE PROTECTION DEVICE

FIELD

Embodiments of the present disclosure relate generally to the field of circuits, and more particularly to an electrostatic discharge protection device.

BACKGROUND

Many electronic circuits require electrostatic discharge (ESD) protection for die pads that connect the electronic circuit to other components. An ESD protection device is typically coupled with the die pad to divert electrical charge that accumulates on the die pad. The ESD protection device may also be used for protection during mismatch overdrive at the die pad.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Figure 1A:
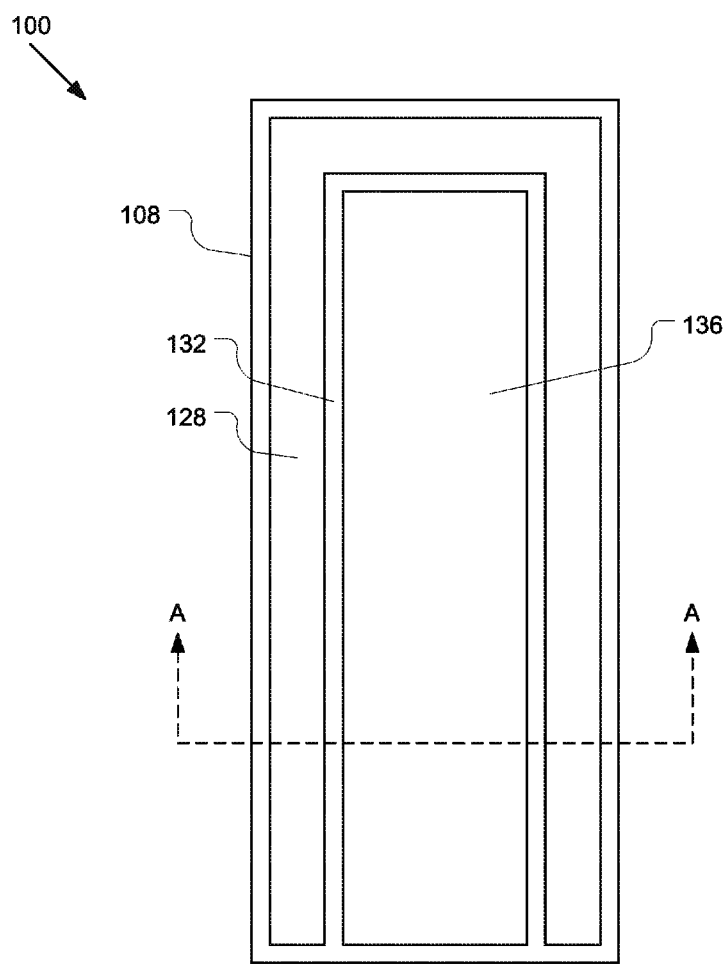
FIG. 1A schematically illustrates a top view of an electrostatic discharge (ESD) protection device in accordance with various embodiments.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "NB" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Various embodiments provide an electrostatic discharge (ESD) protection device for an electronic circuit. In various embodiments, the ESD protection device may include a subcollector, a collector, a base, and an emitter. The subcollector may be disposed on the substrate, the collector may be disposed on the subcollector, the base may be disposed on the collector, and the emitter may be disposed on the base. In various embodiments, each of the subcollector, collector, base, and/or emitter may include one or more epitaxial layers.

In various embodiments, each epitaxial layer may be formed of a doped semiconductor. In some embodiments, the emitter may include a different semiconductor from a semiconductor included in the base. Accordingly, the emitter and the base may form a heterojunction.

In various embodiments, the ESD protection device may include a collector contact coupled with the subcollector and an emitter contact coupled with the emitter. The collector contact and the emitter contact may be formed of a conductive material. In various embodiments, the ESD protection device may not include a conductive base contact coupled with the base of the ESD protection device. Thus, the ESD protection device may be a two-terminal device including the collector contact and the emitter contact. The lack of a base contact may allow the emitter to be laterally spaced closer to the collector contact, which may allow the ESD protection device to use less die area and/or shunt a larger amount of current than other ESD protection devices.

Figure 1B:
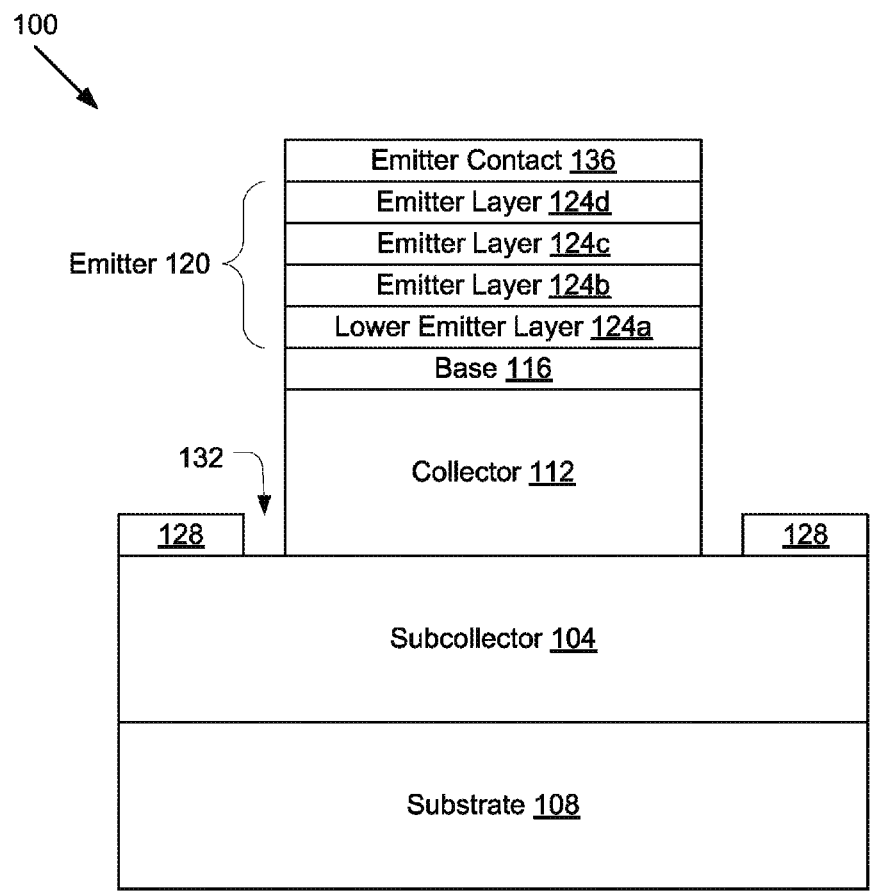
FIG. 1B schematically illustrates a cross-sectional side view of the ESD protection device of FIG. 1A, along reference line A-A shown in FIG. 1A, in accordance with various embodiments.

FIGS. 1A and 1B schematically illustrate a top view and a side cross-sectional view, respectively, of an ESD protection device 100 in accordance with various embodiments. The ESD protection device 100 may be coupled with a die pad (not shown) of an electronic circuit to divert electrical charge from the die pad. The die pad may communicatively couple the electronic circuit with one or more other components. In some embodiments, the electronic circuit may process a radio frequency (RF) signal. For example, the electronic circuit may be an RF amplifier and/or an RF switch. The ESD protection device 100 may be included on a same die with the electronic circuit and the associated die pad. In some embodiments, the ESD protection device 100 may be included in a wireless communication device.

In various embodiments, the ESD protection device may include a subcollector 104 disposed on a substrate 108. In some embodiments, the substrate 108 may include gallium arsenide (GaAs), silicon (Si), or indium phosphate (InP). The subcollector 104 may include a highly doped semiconductor, such as highly doped n-type (n+) semiconductor. The subcollector 104 may include, for example, GaAs in a GaAs-based device in which the substrate 108 is GaAs, Si in a Si-based device in which the substrate 108 is Si, and/or indium gallium arsenide (InGaAs) or InP in an InP-based device in which the substrate 108 is InP.

In various embodiments, the ESD protection device 100 may further include a collector 112 disposed on the subcollector 104. The collector 112 may include a lightly doped semiconductor of a same doping type (e.g., n-type or p-type) as the subcollector 104. For example, the collector 112 may include lightly doped n-type (n-) GaAs in a GaAs-based device, Si in a Si-based device, and/or indium aluminum arsenide (InAlAs) or InGaAs in an InP-based device. The collector 112 may be disposed on only a portion of the subcollector 104. For example, a length and/or width of the collector 112 may be less than a corresponding length and/or width of the subcollector 104. The width of a layer (e.g., collector 112 and/or subcollector 104) may be defined as the left-to-right dimension of the layer as shown in FIG. 1B. Additionally, the length of the layer may be the dimension into the page of FIG. 1B (and the top to bottom dimension shown in FIG. 1A).

In various embodiments, the ESD protection device 100 may further include a base 116 disposed on the collector 112. The base 116 may include a semiconductor that is doped to an opposite doping type from the doping type of the collector 112 and subcollector 104. For example, the base 116 may include a doped p-type semiconductor. In some embodiments, the base 116 may include GaAs in a GaAs-based device, Si in a Si-based device, and/or InGaAs in an InP-based device.

In some embodiments, the base 116 may have a lower surface that is coextensive with an upper surface of the collector 112. That is, the base 116 may substantially cover the upper surface of the collector 112. In other embodiments, a length and/or width of the base 116 may be less than the corresponding length and/or width of the collector 112.

In various embodiments, the ESD protection device 100 may further include an emitter 120 disposed on the base 116. The emitter 120 may include one or more emitter layers 124a-d. In some embodiments, the emitter 120 may have a lower surface that is coextensive with an upper surface of the base 116. That is, the emitter 120 may substantially cover the upper surface of the base 116. In other embodiments, the lower surface of the emitter 120 may have a length and/or width that is smaller than the corresponding length and/or width of the upper surface of the base 116, thereby leaving a base mesa (not shown) adjacent to the emitter 120.

In some embodiments, the emitter 120 may form a heterojunction with the base 116. Accordingly, a lower emitter layer 124a of the emitter 120 that is in direct contact with the base 116 may include a different semiconductor from the semiconductor from which the base 116 is formed. In other embodiments, the lower emitter layer 124a may include the same semiconductor as the base. The lower emitter layer 124a may be doped to a different doping type from the doping type of the base 116. For example, the lower emitter layer 124a may include an n-type semiconductor and the base 116 may include a p-type semiconductor.

In some embodiments, the lower emitter layer 124a may be a lightly doped n-type (n-) semiconductor. For example, the lower emitter layer 124a may include AlGaAs or indium gallium phosphide (InGaP) in a GaAs-based device, silicon in a Si-based device, and/or InP or InAlAs in an InP-based device. It will be apparent that other heterojunction pairs may be used for the base 116 and lower emitter layer 124a in other embodiments. Additionally, in some embodiments, the base 116 and the lower emitter layer 124a may be formed of the same semiconductor.

As shown in FIG. 1B, the emitter 120 may further include an emitter layer 124b disposed on the lower emitter layer 124a, an emitter layer 124c disposed on the emitter layer 124b, and an emitter layer 124d disposed on the emitter layer 124c. In other embodiments, the emitter 120 may include another suitable number and/or arrangement of one or more emitter layers.

In some embodiments, the emitter layer 124b may include a doped semiconductor of the same doping type as the lower emitter layer 124a. The emitter layer 124b may be lightly doped, moderately doped, or highly doped. For example, the emitter layer 124b may include GaAs or another suitable semiconductor.

In some embodiments, the emitter layer 124c may include a graded doped semiconductor. For example, in one non-limiting embodiment, the emitter layer 124c may include highly doped n-type (n+) $In_xGa_{1-x}As$, where x=graded. For example, in some embodiments, x may be graded from zero to about 0.5-0.65, with the higher concentration of indium adjacent the emitter layer 124d. In some embodiments, the emitter layer 124d may include highly doped n-type (n+) $In_xGa_{1-x}As$, where x=0.5.

In various embodiments, the subcollector 104, collector 112, base 116, and/or emitter 120 may be epitaxially deposited, and may each include one or more epitaxial layers. The subcollector 104, collector 112, base 116, and emitter 120 may all include doped semiconductors, as described above.

In various embodiments, the ESD protection device 100 may further include a collector contact 128 disposed on and coupled with the subcollector 104. The collector contact 128 may be formed of a conductive material to provide an electrical connection to the subcollector 104. In some embodiments, the collector contact may include a pair of elongate regions coupled to one another at one end of the elongate regions (e.g., to form a "U" shape as shown in FIG. 1A). The collector 112, base 116, and emitter 120 may be disposed between the elongate regions of the collector contact. The collector contact 128 may be separated from the collector 112 by an isolation region 132.

In various embodiments, the ESD protection device 100 may further include an emitter contact 136 disposed on and coupled with the emitter 120. The emitter contact 136 may be formed of a conductive material to provide an electrical connection to the emitter 120. In some embodiments, the emitter contact 136 may have a lower surface that is coextensive with an upper surface of the emitter 120. In other embodiments, the length and/or width of the lower surface of the emitter contact 136 may be smaller than the corresponding length and/or width of the upper surface of the emitter 120, thereby leaving an emitter mesa (not shown) adjacent to the emitter contact 136.

In various embodiments, the ESD protection device 100 may not include a conductive base contact coupled with the base 116. Accordingly, the ESD protection device 100 may be a two-terminal device, with collector contact 128 and emitter contact 136 but no base contact. The lack of a base contact may allow the emitter 120 to be laterally spaced (e.g., in a direction parallel to a plane of the substrate 108) closer to the collector contact 128 than in three-terminal heterojunction bipolar transistors (HBTs). Having the emitter 120 disposed closer to the collector contact 128 may allow the ESD protection device 100 to use less die area (e.g., less area on substrate 108) and/or shunt a larger amount of current than three-terminal HBTs.

In various embodiments, to provide ESD protection for a die pad of an electronic circuit, the collector contact 128 of ESD protection device 100 may be coupled with the die pad, and the emitter contact 136 may be coupled with a ground terminal. When the voltage on the die pad causes the collector-emitter voltage of the ESD protection device 100 (e.g., the voltage drop from the collector contact 128 to the emitter contact 136 to exceed the collector-emitter breakdown voltage, BVceo, of the ESD protection device 100, the voltage across the ESD protection device 100 decreases and current may be shunted from the collector contact 128 to the emitter contact 136 (e.g., via the subcollector 104, collector 112, base 116, and emitter 120). Accordingly, the ESD protection device 100 may be used to prevent electrical charge from accumulating on the die pad that may otherwise result in unwanted ESD events.

Figure 2A:
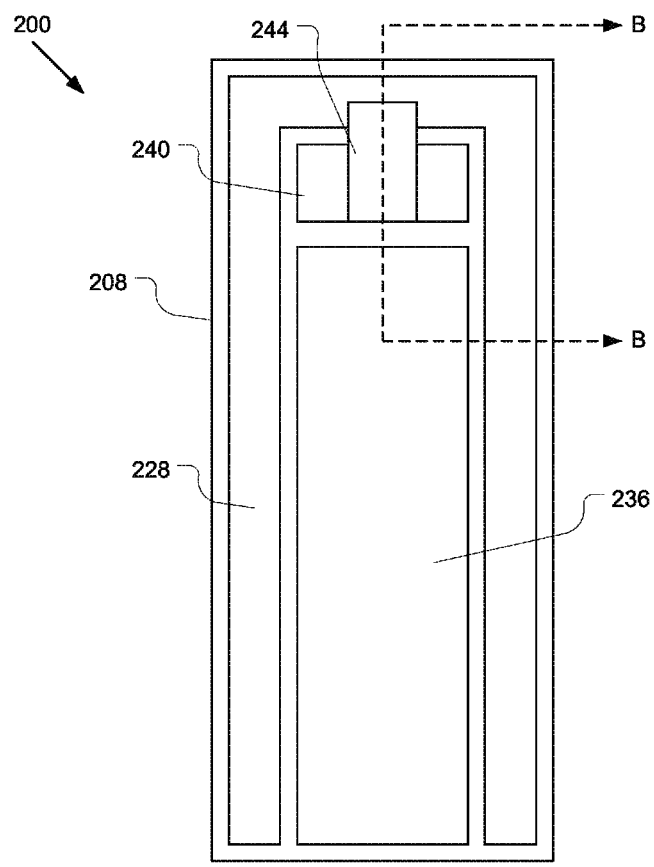
FIG. 2A schematically illustrates a top view of another ESD protection device in accordance with various embodiments.
Figure 2B:
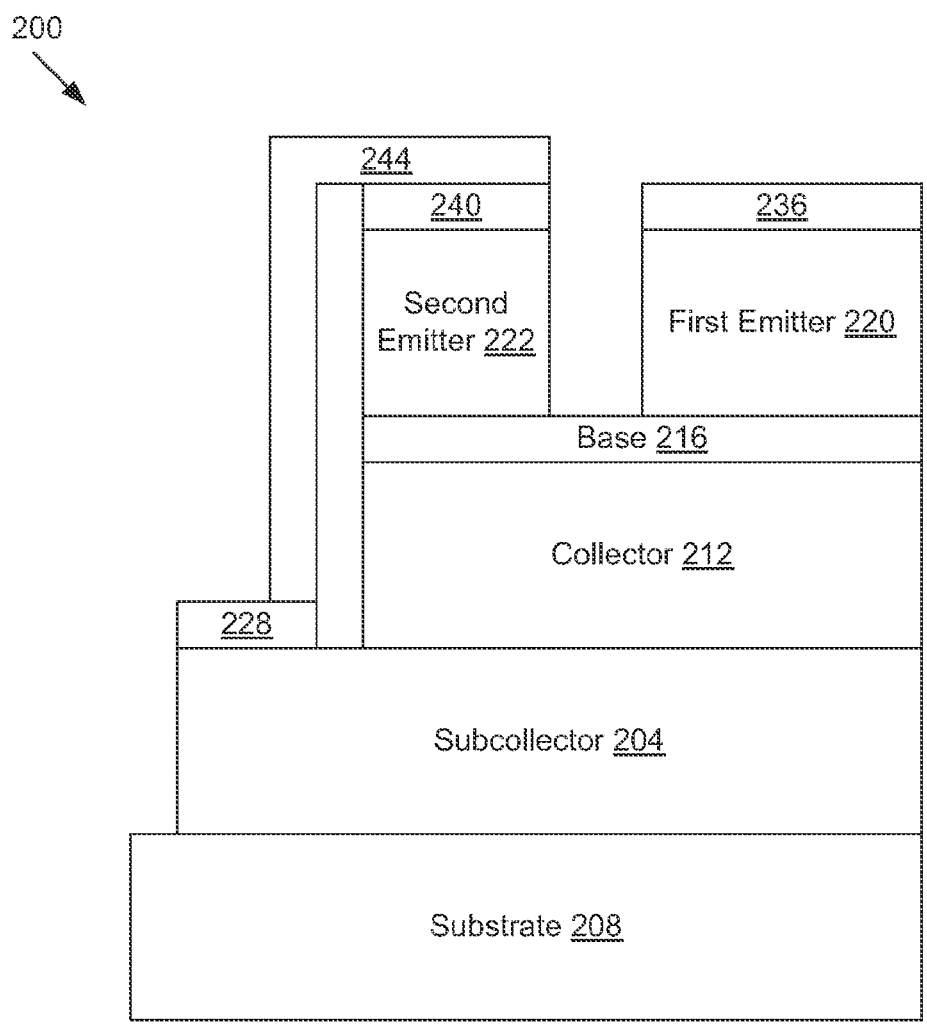
FIG. 2B schematically illustrates a cross-sectional side view of the ESD protection device of FIG. 2A, along reference line B-B shown in FIG. 2A, in accordance with various embodiments.

FIG. 2 illustrates another ESD protection device 200 in accordance with various embodiments. ESD protection device 200 includes a first emitter 220 and a second emitter 222. The first emitter 220 and second emitter 222 are disposed adjacent to one another on a base 216. The base 216 is disposed on a collector 212, and the collector 212 is disposed on a subcollector 204. The subcollector 204 is disposed on a substrate 208. The subcollector 204, collector 212, base 216, first emitter 220, and second emitter 222 may each include one or more layers of doped semiconductors.

In various embodiments, the ESD protection device 200 may include a collector contact 228 disposed on and coupled with the subcollector 204. The ESD protection device 200 may further include a first emitter contact 236 disposed on and coupled with the first emitter 220 and a second emitter contact 240 disposed on and coupled with the second emitter 222. In various embodiments, the second emitter 222 may be smaller than the first emitter 220 and/or the second emitter contact 240 may be smaller than the first emitter contact 236.

In various embodiments, the second emitter contact 240 may be conductively coupled with the collector contact 228 (e.g., by a conductive structure 244). The conductive coupling between the second emitter 222 and the subcollector 204 (via the second emitter contact 240, conductive structure 244, and conductor contact 232) may form a diode between the base 216 and the subcollector 204 of the ESD protection device 200. Accordingly, the second emitter 222 coupled to the subcollector 204 may provide a lower trigger voltage for the ESD protection device 200 than the trigger voltage of the ESD protection device 100. That is, the ESD protection device 200 may trigger the shunt current from the collector contact 232 to the first emitter contact 236 at a voltage that is lower than the collector-emitter breakdown voltage BVceo. For example, the trigger voltage of the ESD protection device 200 may be equal to the sum of the first emitter-base breakdown voltage and the second emitter-base turn-on voltage.

Figure 3:
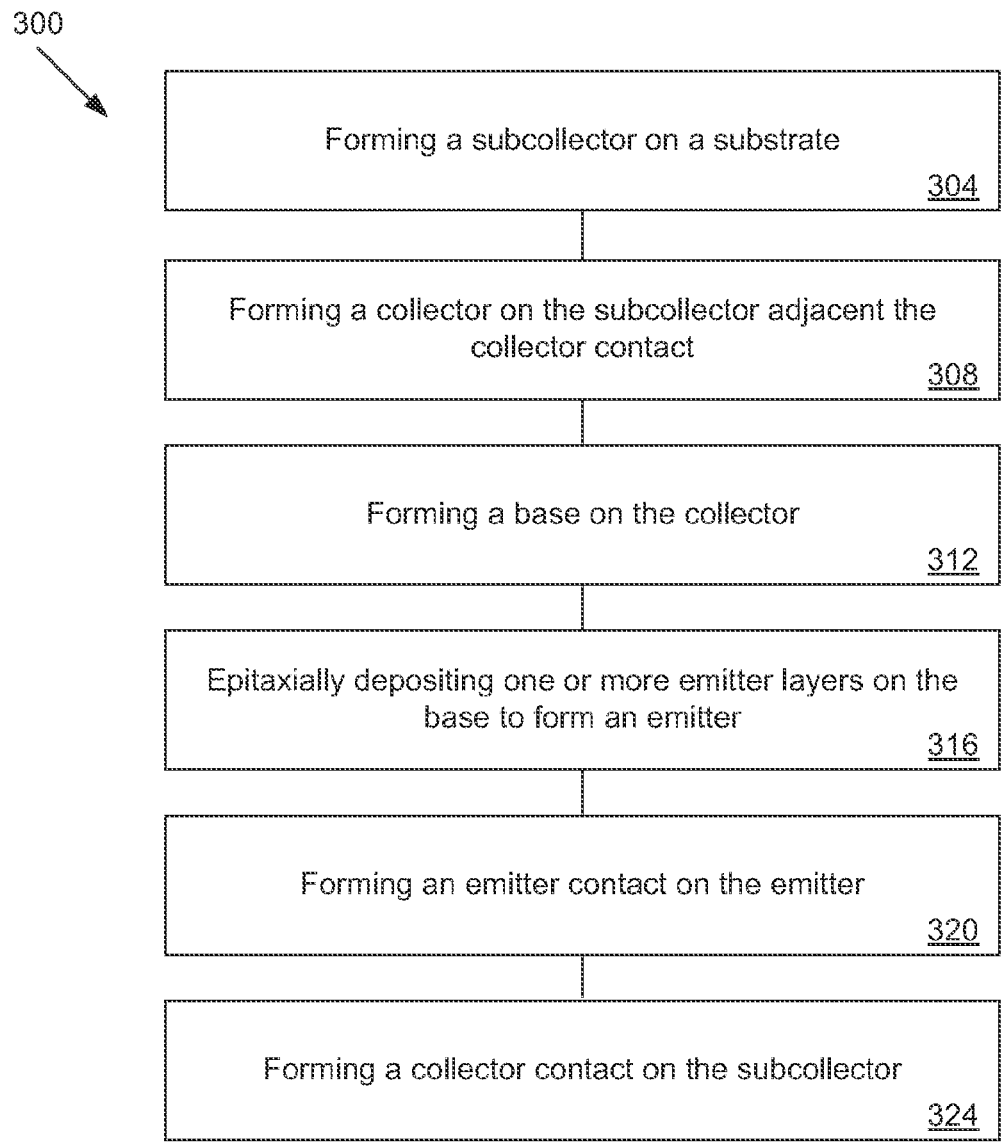
FIG. 3 illustrates method of forming an ESD protection device in accordance with various embodiments.

FIG. 3 illustrates a method 300 for forming an ESD protection device (e.g., ESD protection device 100 or 200) in accordance with various embodiments.

At 304, the method 300 may include forming a subcollector (e.g., subcollector 104 or 204) on a substrate (e.g., substrate 108 or 208). In some embodiments, the subcollector may be formed by epitaxial deposition.

At 308, the method 300 may include forming a collector (e.g., collector 112 or 212) on the subcollector. At 312, the method 300 may include forming a base (e.g., base 116 or 216) on the collector. The collector and/or base may be epitaxially deposited.

At 316, the method 300 may include depositing one or more emitter layers (e.g., emitter layers 124a-d) on the base to form an emitter (e.g., emitter 100). At 320, the method 300 may further include forming an emitter contact (e.g., emitter contact 136) on the emitter.

At 324, the method 300 may include forming a collector contact (e.g., collector contact 128 or 228) on the subcollector. The collector contact may be formed by, for example, depositing a conductive material on the subcollector. The collector contact may be separated from the collector by an isolation region.

In some embodiments, the ESD protection device formed by method 300 may include a single emitter and/or emitter contact. In other embodiments, the method 300 may include forming first and second emitters (e.g., first emitter 220 and second emitter 222) on the base. In these embodiments, the method 300 may further include forming a first emitter contact (e.g., first emitter contact 236) on the first emitter and a second emitter contact (e.g., second emitter contact 240) on the second emitter. The method 300 may further include conductively coupling the second emitter contact to the collector contact (e.g., by forming a conductive structure 244).

In various embodiments, the subcollector, collector, base and one or more emitter layers may include doped semiconductors. In some embodiments, a lower emitter layer of the one or more emitter layers, that is in direct contact with the base, may be formed of a different semiconductor than the semiconductor from which the base is formed. Accordingly, the emitter and the base may form a heterojunction.

In various embodiments, the ESD protection device formed by method 300 may be a two-terminal device including the collector contact and the emitter contact, but no base contact.

Figure 4:
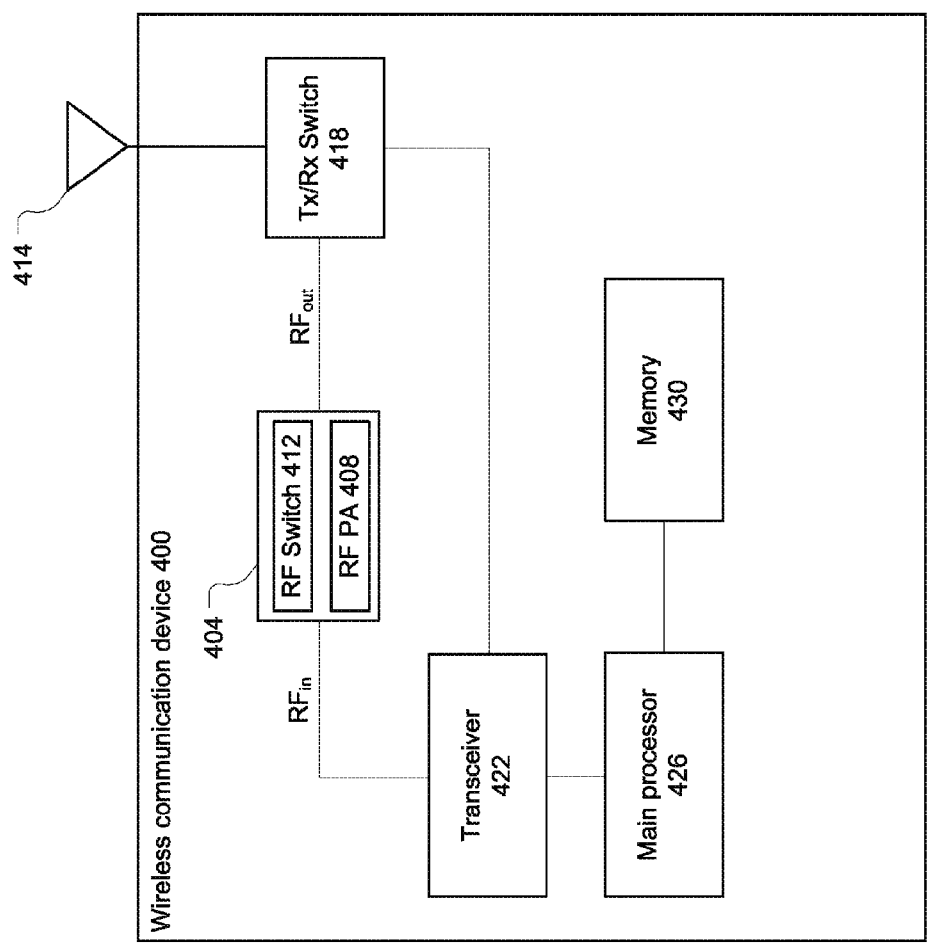
FIG. 4 is a block diagram of an exemplary wireless communication device in accordance with various embodiments.

A block diagram of an exemplary wireless communication device 400 is illustrated in FIG. 4 in accordance with some embodiments. Wireless communication device 400 may have an RF power amplifier (PA) module 404 including one or more RF PA circuits 408 and/or RF switches 412. In addition to the RF PA module 404, the wireless communication device 400 may have an antenna structure 414, a Tx/Rx switch 418, a transceiver 422, a main processor 426, and a memory 430 coupled with each other at least as shown. While the wireless communication device 400 is shown with transmitting and receiving capabilities, other embodiments may include devices with only transmitting or only receiving capabilities.

In various embodiments, the RF PA module 404 may include one or more ESD protection devices (e.g., ESD protection device 100 or 200). The ESD protection devices may be coupled with respective die pads of the RF PA module 404. The die pads may, for example, communicatively couple the RF PA module 404 to one or more other components of the wireless communication device 400, such as the transceiver 422 or the Tx/Rx switch 418. Alternatively, or additionally, one or more other components of the wireless communication device 400 may include an ESD protection device.

In various embodiments, the wireless communication device 400 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

The main processor 426 may execute a basic operating system program, stored in the memory 430, in order to control the overall operation of the wireless communication device 400. For example, the main processor 426 may control the reception of signals and the transmission of signals by transceiver 422. The main processor 426 may be capable of executing other processes and programs resident in the memory 430 and may move data into or out of memory 430, as desired by an executing process.

The transceiver 422 may receive outgoing data (e.g., voice data, web data, e-mail, signaling data, etc.) from the main processor 426, may generate the $RF_{in}$ signal(s) to represent the outgoing data, and provide the $RF_{in}$ signal(s) to the RF PA module 404. The transceiver 422 may also control the RF PA module 404 to operate in selected bands and in either full-power or backoff-power modes. In some embodiments, the transceiver 422 may generate the $RF_{in}$ signal(s) using OFDM modulation.

The RF PA module 404 may amplify the $RF_{in}$ signal(s) to provide $RF_{out}$ signal(s) as described herein. The $RF_{out}$ signal(s) may be forwarded to the Tx/Rx switch 418 and then to the antenna structure 414 for an over-the-air (OTA) transmission. In some embodiments, a duplexer and/or Tx filter (not shown) may be coupled between the RF PA module 404 and the Tx/Rx switch 418.

In a similar manner, the transceiver 422 may receive an incoming OTA signal from the antenna structure 414 through the Tx/Rx switch 418. The transceiver 422 may process and send the incoming signal to the main processor 426 for further processing.

In various embodiments, the antenna structure 414 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless communication device 400 is given by way of example and that, for simplicity and clarity, only so much of the construction and operation of the wireless communication device 400 as is necessary for an understanding of the embodiments is shown and described. Various embodiments contemplate any suitable component or combination of components performing any suitable tasks in association with wireless communication device 400, according to particular needs. Moreover, it is understood that the wireless communication device 400 should not be construed to limit the types of devices in which embodiments may be implemented.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. An electrostatic discharge (ESD) protection apparatus comprising:
    a subcollector;
    a collector contact disposed on the subcollector;
    a collector disposed on the subcollector adjacent the collector contact;
    a base disposed on the collector;
    an emitter disposed on the base; and
    an emitter contact disposed on the emitter;
    wherein the ESD protection apparatus is a two-terminal device including the collector contact and the emitter contact, but no base contact conductively coupled with the base.

2. The ESD protection apparatus of claim 1, wherein the emitter has a lower surface that is coextensive with an upper surface of the base.

3. The ESD protection apparatus of claim 1, wherein the apparatus includes a single emitter contact.

4. The ESD protection apparatus of claim 1, wherein the emitter is a first emitter and the emitter contact is a first emitter contact, and wherein the apparatus further includes:
    a second emitter disposed on the base; and
    a second emitter contact that is conductively coupled with the second emitter and the collector contact.

5. The ESD protection apparatus of claim 1, wherein the collector contact includes a pair of elongate regions coupled to one another at one end of the elongate regions, and wherein the emitter is disposed between the elongate regions of the collector contact.

6. The ESD protection apparatus of claim 1, wherein the collector contact is coupled with a die pad of an electronic circuit to provide ESD protection for the die pad.

7. The ESD protection apparatus of claim 1, wherein the subcollector, collector, base, and emitter include doped semiconductors.

8. The ESD protection apparatus of claim 7, wherein the emitter includes a different semiconductor from a semiconductor included in the base.

9. A method for forming an electrostatic discharge (ESD) protection apparatus, comprising:
    forming a subcollector on a substrate;
    forming a collector on the subcollector;
    forming a base on the collector;
    depositing one or more emitter layers on the base to form an emitter;
    forming an emitter contact on the emitter; and
    forming a collector contact on the subcollector adjacent to the collector;
    wherein the subcollector, collector, base, and one or more emitter layers include doped semiconductors; and
    wherein the ESD protection apparatus is a two-terminal device including the collector contact and the emitter contact, but no base contact conductively coupled with the base.

10. The method of claim 9, wherein the emitter has a lower surface that is coextensive with an upper surface of the base.

11. The method of claim 9, wherein the ESD protection apparatus includes a single emitter contact.

12. The method of claim 9, wherein the emitter is a first emitter and the emitter contact is a first emitter contact, and wherein the method further includes:
    forming a second emitter on the base adjacent to the first emitter;
    forming a second emitter contact on the second emitter; and
    conductively coupling the second emitter contact with the collector contact.

13. The method of claim 9, wherein the collector contact includes a pair of elongate regions coupled to one another at one end of the elongate regions, and wherein the emitter is disposed between the elongate regions of the collector contact and separated from the collector contact by an isolation region.

14. The method of claim 9, wherein the emitter forms a heterojunction with the base.

15. A system comprising:
    an electronic circuit including a die pad to couple the electronic circuit with another component; and
    an electrostatic discharge (ESD) protection device coupled with the die pad, the ESD protection device including:
        a subcollector;

a collector contact disposed on the subcollector;

a collector disposed on the subcollector adjacent the collector contact;

a base disposed on the collector, wherein the ESD protection device does not include a conductive base contact coupled with the base;

an emitter disposed on the base, the emitter having one or more emitter layers including a lower emitter layer formed of a different semiconductor than a semiconductor from which the base is formed; and an emitter contact disposed on the emitter.

16. The system of claim 15, wherein the ESD protection device includes a single emitter contact.

17. The system of claim 15, wherein the emitter is a first emitter and the emitter contact is a first emitter contact, and wherein the apparatus further includes:

a second emitter that is disposed on the base adjacent to the first emitter; and a second emitter contact disposed on the second emitter that is conductively coupled with the collector contact.

18. The system of claim 15, wherein a lower surface of the emitter is coextensive with an upper surface of the base.

19. The system of claim 15, wherein the collector contact of the ESD protection device is coupled with the die pad and the emitter contact of the ESD protection device is coupled with a ground potential.

20. The system of claim 15, wherein the electronic circuit is a radio frequency (RF) circuit to process an RF transmission signal for transmission over a wireless communication network.

* * * * *

UNITED STATES PATENT AND TRADEMARK OFFICE
CERTIFICATE OF CORRECTION

Page 1 of 1

PATENT NO. : 9,099,518 B1
APPLICATION NO. : 14/172800
DATED : August 4, 2015
INVENTOR(S) : Timothy S. Henderson and Robert E. Knapp It is certified that error appears in the above-identified patent and that said Letters Patent is hereby corrected as shown below:

In the Specification:

In column 2, line 8, replace "NB" with --A/B--.

Signed and Sealed this
Fifteenth Day of December, 2015

Michelle K. Lee
*Director of the United States Patent and Trademark Office*